(12) United States Patent
Hoshi et al.

(10) Patent No.: US 6,181,130 B1
(45) Date of Patent: Jan. 30, 2001

(54) MAGNETIC SENSOR HAVING EXCITATION COIL INCLUDING THIN-FILM LINEAR CONDUCTOR SECTIONS FORMED ON BOBBIN WITH DETECTION COIL WOUND THEREON

(75) Inventors: Norimitsu Hoshi, Shiroichi; Naoyuki Sato, Sendai, both of (JP)

(73) Assignee: Tokin Corporation, Miyagi (JP)

( * ) Notice: Under 35 U.S.C. 154(b), the term of this patent shall be extended for 0 days.

(21) Appl. No.: 09/122,524

(22) Filed: Jul. 24, 1998

(30) Foreign Application Priority Data

| Jul. 25, 1997 | (JP) | 9-215680 |
| Jul. 25, 1997 | (JP) | 9-215682 |
| Apr. 1, 1998 | (JP) | 10-088848 |

(51) Int. Cl.$^7$ .......... G01R 33/05; G01C 17/28; H01F 5/00; H01F 17/06; H01F 27/28
(52) U.S. Cl. .......... 324/253; 324/249; 33/361; 336/200; 336/221; 336/229
(58) Field of Search .......... 324/244, 247, 324/249, 253–255, 260; 33/361, 363 R; 336/200, 221, 229

(56) References Cited

U.S. PATENT DOCUMENTS 3,483,497 * 12/1969 Clark et al. .......... 336/229 X
4,103,267 * 7/1978 Olschewski .......... 336/229 X (List continued on next page.)

FOREIGN PATENT DOCUMENTS 35 5 19 609 A1 12/1986 (DE).

(List continued on next page.)

OTHER PUBLICATIONS

"High Manufacturability, Low Cost Torroidal Inductor", IBM Technical Disclosure Bulletin, vol. 32, No. 4B, Sep. 1, 1989, pp. 323–324.

(List continued on next page.)

Primary Examiner—Gerard Strecker
(74) Attorney, Agent, or Firm—Frishauf, Holtz, Goodman, Langer & Chick, P.C.

(57) ABSTRACT

A magnetic sensor includes a bobbin having one surface provided with a toroidal groove, and a toroidal inductor accommodated in the groove. The toroidal inductor has a toroidal core and an excitation coil wound on the toroidal core. The excitation coil has a conductive pattern of a plurality of thin-film linear conductors individually extending in a radial direction on a surface of the bobbin and on inner side and bottom surfaces of the toroidal groove with a predetermined angular space, a toroidal core received in the groove, and a plurality of connecting wires each of which is bridged over the toroidal groove and toroidal core to interconnect an inner end of one of the thin-film linear conductors and an outer end of a next adjacent one of the thin-film linear conductors. The conductive pattern and the connecting wires form the excitation coil wound around the toroidal core. Thus, the toroidal inductor is formed in the toroidal groove. The connecting wire may be formed as a conductor pattern on a printed circuit board. In another embodiment, the toroidal inductor may be formed on a printed circuit board, and the toroidal inductor is accommodated in the groove of the bobbin without the conductive pattern by coupling the printed circuit board onto the bobbin.

19 Claims, 8 Drawing Sheets

U.S. PATENT DOCUMENTS

| | | | |
|---|---|---|---|
| 4,825,166 | * 4/1989 | MacGugan | 324/253 X |
| 4,907,346 | 3/1990 | Watanabe . | |
| 4,967,156 | * 10/1990 | Seitz | 324/253 X |
| 5,191,699 | 3/1993 | Ganslmeier et al. . | |
| 5,430,613 | * 7/1995 | Hastings et al. | 336/229 X |

FOREIGN PATENT DOCUMENTS

| | | |
|---|---|---|
| 0175069 A1 | 3/1986 | (EP) . |
| 0473875 A1 | 3/1992 | (EP) . |
| 0490438 A1 | 6/1992 | (EP) . |
| 9-5083 | 1/1997 | (JP) . |
| WO 93/08450 | 4/1993 | (WO) . |

OTHER PUBLICATIONS

Patent Abstracts of Japan, vol. 018, No. 290 (E–1557), Jun. 2, 1994 & JP 06 061055 A (Toyota Autom Loom Works, Ltd.) Mar. 4, 1994.

Patent Abstracts of Japan, vol. 017, No. 188 (E–1349), Apr. 13, 1993 & JP 04 337610 A (Fujitsu Ltd), Nov. 25, 1992.

Patent Abstracts of Japan, vol. 097, No. 005, May 30, 1997 & JP 09 005083 A (Tokin Corp.), Jan. 10, 1997.

* cited by examiner

MAGNETIC SENSOR HAVING EXCITATION COIL INCLUDING THIN-FILM LINEAR CONDUCTOR SECTIONS FORMED ON BOBBIN WITH DETECTION COIL WOUND THEREON

BACKGROUND OF THE INVENTION

This invention relates to a magnetic sensor for detecting a weak magnetic field as a stray magnetic field generated in an automobile, a ship, an aircraft, a domestic electrical appliance, a medical instrument, and the like.

A conventional magnetic sensor comprises a toroidal inductor accommodated in a bobbin having at least one detection coil wound thereon. The toroidal inductor comprises a ring-shaped or toroidal core contained in a ring-shaped core case on which a toroidal coil as an excitation coil is wound.

The magnetic sensor is a transformer. When an exciting AC voltage as a primary voltage is applied to the excitation coil, AC magnetic fluxes are induced to flow in the toroidal core. Therefore, a secondary voltage as an output voltage is induced on the detection coil. When the stray magnetic field is applied to the toroidal core, the AC magnetic fluxes flowing in the toroidal core are affected by the stray magnetic field and change. As a result, the output voltage is changed in the amplitude. That is, the output voltage is amplitude-modulated by the stray magnetic field. Therefore, the stray magnetic field can be detected from the amplitude variation of the output voltage.

Manufacture of the above-mentioned magnetic sensor requires troublesome winding operations for forming the excitation coil and at least one detection coil. Particularly, in the winding operation for the excitation coil, a wire must be wound on the toroidal core, actually the ring-shaped core case to form the toroidal excitation coil. This winding operation is quite troublesome because the wire is made to repeatedly pass through an inner bore of the ring-shaped core case until it is wound around the core case by the number of turns ranging from several tens to several hundreds. Thus, it takes a long time for such a winding operation.

If the toroidal inductor has a small size, the inner bore of the ring-shaped core case has a small diameter. In this event, it becomes difficult to perform the winding operation for making the wire pass through the inner bore of the ring-shaped core case. The result is that miniaturization of the toroidal inductor is limited.

Recently, there are available in commerce small-sized magnetic sensors using printed circuit boards stacked holding a relatively thin toroidal core therebetween. The printed circuit boards have, as thin conductor patterns, sections of excitation coils and detection coils. Those sections are connected to one another through through-holes in the circuit boards to thereby form those coils.

Although the known magnetic sensor of the printed circuit type is formed in a small size, it is low in reliability. This is because that the thin toroidal core is readily deformed and/or destroyed by mechanical strain of printed circuit boards caused by undesired external force applied to the printed circuit boards.

In the printed type magnetic sensor, it is impossible to use a bulk type toroidal core which has a relatively large axial size. Further, the toroidal core is badly affected by heat during the reflowing operation to solder the conductor patterns of the printed circuit boards.

SUMMARY OF THE INVENTION

It is an object of this invention to provide a small-sized magnetic sensor with excellent reliability wherein a toroidal core is protected from external forces, and no winding operation is required for an excitation coil.

It is another object to provide a magnetic sensor having a structure which is capable of using a toroidal core which is a bulk type having a relatively large axial size.

It is another object of this invention to provide a magnetic sensor which is simple in structure, reduced in the number of components, easy to produce and therefore, low in cost.

It is yet another object of this invention to provide a high-performance magnetic sensor which is capable of preventing a magnetic core from being influenced by heat such as by soldering upon bonding of conductive patterns and is therefore capable of detecting a weak magnetic field with high accuracy.

According to this invention, there is provided a magnetic sensor comprising a bobbin, a toroidal inductor mounted within the bobbin, the toroidal inductor comprising a toroidal magnetic core and an excitation toroidal coil wound around the toroidal core, and at least one detection coil wound on the bobbin, wherein the bobbin comprises a bobbin case having a toroidal groove accommodating the toroidal inductor and a bobbin cover coupled to the bobbin case to cover the toroidal groove. One of the bobbin case and the bobbin cover has a conductor pattern, the conductor pattern comprising a plurality of angularly speed, radially extending thin-film linear conductors each having a radial inner end and a radial outer end. A plurality of connecting conductors radially extend over the toroidal magnetic core to connect the radial inner end of a corresponding one of the thin-film linear conductors to the radial outer end of an adjacent one of the thin-film linear conductors so that the excitation toroidal coil is formed by the conductor pattern and the connecting conductors.

According to an embodiment, the conductor pattern is formed on the bobbin case to radially extend from an inside to an outside of the toroidal groove, the connecting conductors being wires, and the bobbin cover being a plastic resin loaded on the bobbin case to cover the connecting conductors, the toroidal core and the conductor patterns together.

According to another embodiment, the conductor pattern is formed on the bobbin case to radially extend from an inside to an outside of the toroidal groove, the bobbin cover being a printed circuit board having the connecting conductors as another conductor pattern formed thereon.

According to another embodiment, the bobbin cover is a printed circuit board having the conductor pattern, the connecting conductors being connecting wires, thus, the toroidal inductor being fixedly mounted on the bobbin cover and being accommodated within the toroidal groove in the bobbin case.

DESCRIPTION OF THE PREFERRED EMBODIMENTS

Figure 1:
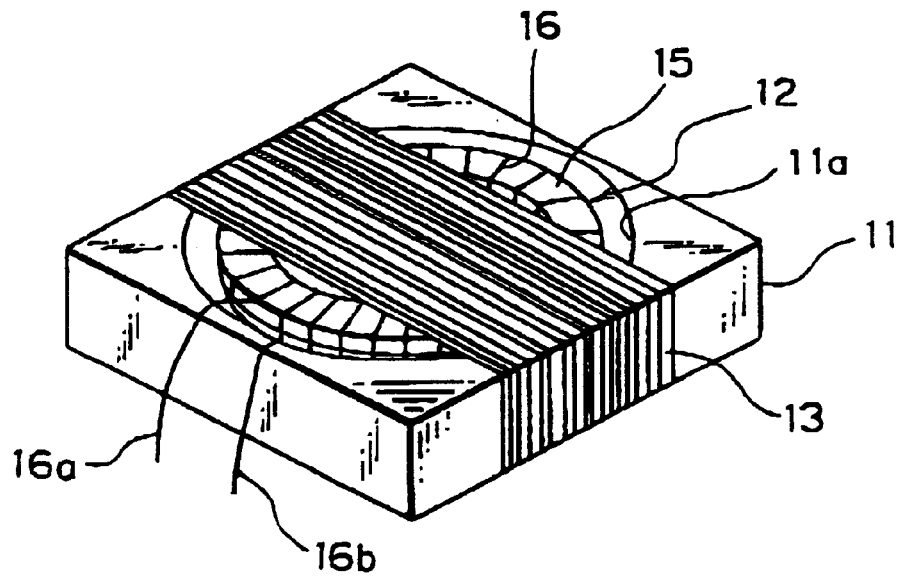
FIG. 1 is a perspective view of a conventional magnetic sensor.

In order to facilitate an understanding of this invention, description will at first be made about a conventional magnetic sensor with reference to FIG. 1.

Referring to FIG. 1, the conventional magnetic sensor comprises an insulator case 11, a toroidal inductor 12 accommodated in the case 11, at least one detection coil 13 wound around the case 11. Two coils are usually provided in perpendicular to each other to detect X and Y components of the stray magnetic field.

The case 11 is often referred to as a "bobbin" because one or more wires are wound on the case 11 to form the detection coils. The bobbin 11 is formed in, for example, a rectangular shape having a circular depression or a toroidal groove 11a in its top surface, as shown in the figure. Therefore, the bobbin 11 is formed in a case shape. The toroidal inductor 12 is contained in the groove 11a, then, after being covered by a bobbin cover if it is desired, the detection coil 13 is wound on the bobbin with or without a bobbin cover (not shown). In this example, there is only shown a single or X direction detection coil 13.

The toroidal inductor 12 comprises a ring-shaped magnetic core or a toroidal core (not shown) made of a high-permeability material, for example, a stack of permalloy and amorphous magnetic foils. The toroidal core is contained in a ring-shaped core case 15, and an excitation coil 16 is wound around the core case 15 in a toroidal fashion. The excitation coil 16 has two lead wires 16a and 16b which are drawn out of the bobbin 11 when the toroidal inductor 12 is contained in the bobbin 11.

The conventional magnetic sensor has problems described in the Background of the Invention.

Figure 2:
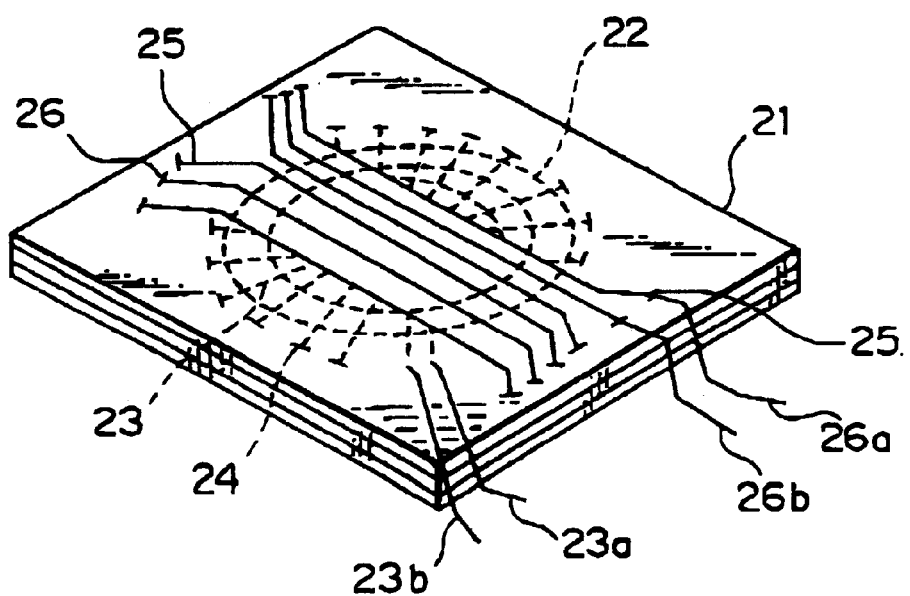
FIG. 2 is a perspective view of a known magnetic sensor of a printed circuit type.

Referring to FIG. 2, another known magnetic sensor using printed circuit boards comprises four printed circuit boards 21 stacked in a multi-layered structure, and a thin-plate toroidal core 22 held between two inner printed circuit boards. The inner printed circuit boards have individual conductor patterns of radially extending linear conductors 23. Those conductors 23 on two inner printed circuit boards are connected each one to a corresponding one through through-holes 24 to form a toroidal coil around the toroidal core 22. The toroidal coil formed by the linear conductor sections 23 serves as the excitation coil.

Two outer printed circuit boards have individual conductor patterns of diametrically extending linear conductors 25. Those conductors 25 on two outer printed circuit boards are connected each one to a corresponding one to form a detection coil through through holes 26.

Two lead terminals of the excitation coil are led out through through-holes on the uppermost printed circuit board and drawn out of the sensor as shown at 23a and 23b in the figure. Two lead terminal of the detection coil is also drawn out of the sensor, as shown at 26a and 26b in the figure, from the uppermost printed circuit board.

The known printed-type magnetic sensor has problems described in the Background of the Invention.

Now, description will be made about several embodiments of this invention with reference to the drawings.

Figure 3:
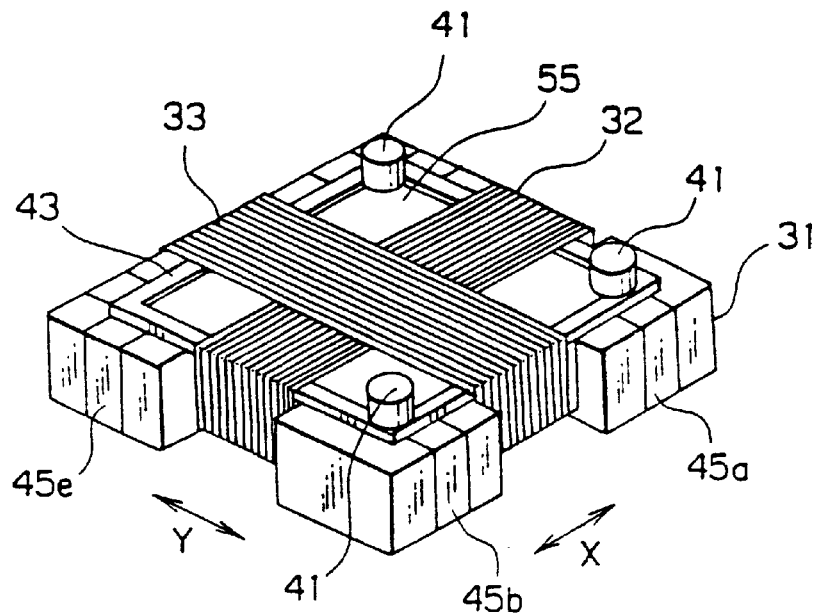
FIG. 3 is a perspective view of a magnetic sensor according to a first embodiment of this invention.

Referring to FIG. 3, a magnetic sensor according to a first embodiment of this invention comprises an insulator bobbin 31 of a rectangular prism shape, and first and second detection coils 32 and 33 wound around the bobbin 31 to be perpendicular to each other, that is, in X and Y arrow directions.

Figure 4:
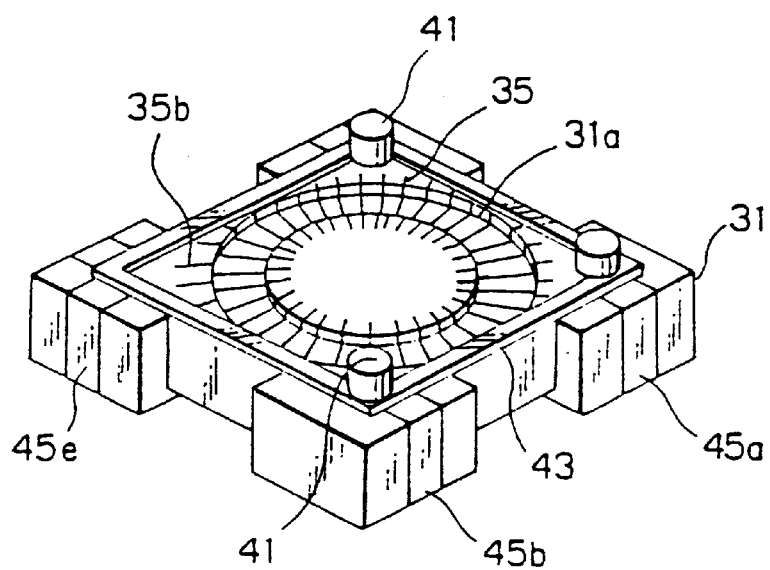
FIG. 4 is a perspective view of a bobbin case of the magnetic sensor illustrated in FIG. 3.
Figure 5:
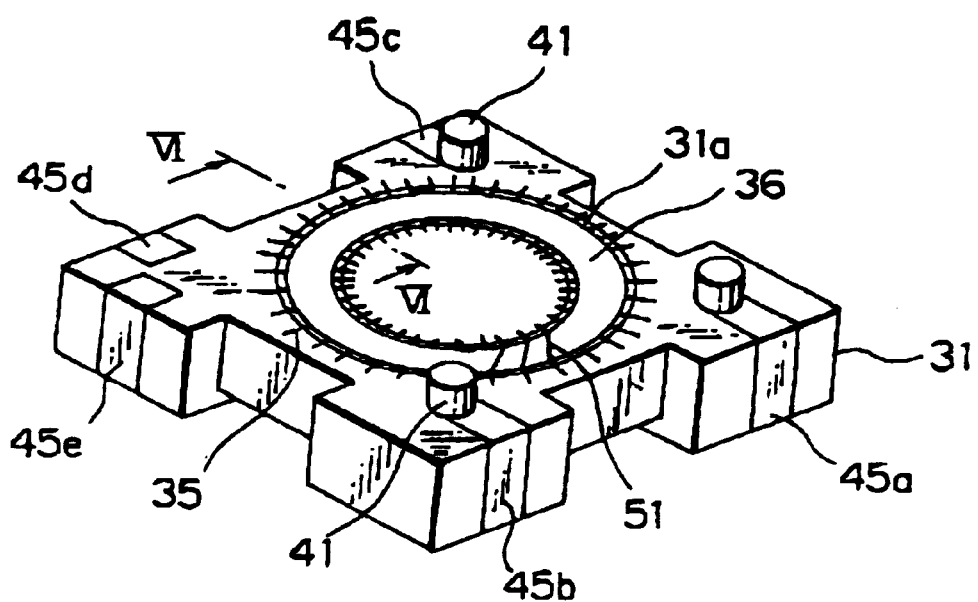
FIG. 5 is a perspective view similar to FIG. 4 but a magnetic core being contained in the bobbin case.
Figure 6:
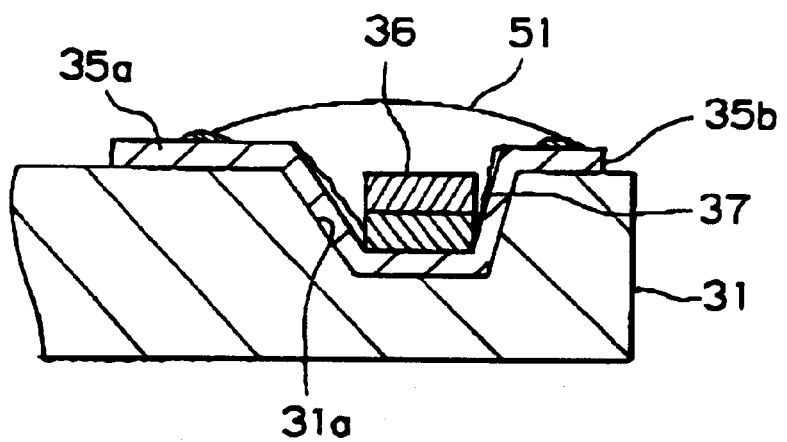
FIG. 6 is a sectional view taken along a line VI—VI in FIG. 5.

Referring to FIGS. 4 through 6, the bobbin 31 has a top surface provided with a ring-shaped or toroidal groove 31a having a reversed trapezoidal section. The bobbin 31 is formed by molding a plastic resin material such as epoxy resin or liquid crystal polymer by the use of a resin molding apparatus.

In an example, the bobbin has a side of 13 mm and a thickness of 2.5 mm.

The toroidal groove 31a illustrated in the figure has a circular ring shape. However, a polygonal shape can be adopted for the toroid of the groove instead of the circular ring shape.

On the top surface of the bobbin 31 and across the groove 31a, a radial conductive pattern 35 is formed which comprises a plurality of thin-film linear conductors or linear conductive thin films (each of which is also represented by 35) which are equiangularly spaced from each other and radially extend from a center of the top surface of the bobbin 31 towards an outer periphery, as best shown in FIG. 4.

In an example, the conductive pattern of linear conductive thin films 35 comprises a copper layer deposited on the bobbin, a nickel layer formed on the copper layer by electroless plating, and a gold plating layer on the nickel layer and have an total thickness of a predetermined size. The linear conductive thin films 35 have a same width of 0.1 $\mu$m and are disposed at a pitch of 0.3 $\mu$m circumferentially. Each of the films 35 radially extends across groove 31a from a position adjacent the center of the circular groove to a position outside the groove 31a with the extended end portion outside the groove 31a being offset by one pitch comparing with the inner end portion thereof.

As illustrated in FIGS. 5 and 6, a ring-shaped magnetic core or a toroidal core 36 is made of a high-permeability material such as an amorphous magnetic plate or foil, an amorphous magnetic wire, and a permalloy plate or foil, and is received in the groove 31a of the bobbin 31. In an example, the core 36 has a thickness of 15–30 $\mu$m.

On the inner surfaces of the groove 31a with the conductive patterns 35 deposited thereon, a resist 37 is applied to electrically insulate the magnetic core 36 of the high-permeability material from the conductive patterns 35, as illustrated in FIG. 6. Instead of the resist 37, an insulating resin material may be printed on the inner surfaces of the groove 31a. Alternatively, it is possible to use the core 36 which has an insulation surface coating.

The bobbin 11 further has a plurality of conductive pins 41 standing on the top surface thereof. Specifically, three pins 41 are placed in the vicinity of three corners of the top surface of the bobbin 31, respectively. These pins 41 serve to fasten and portions of the first and the second detection coils 32 and 33 wrapped thereto. In addition, the three pins 41 serve to position a frame member 43 illustrated in FIG. 4 to a predetermined location on the top surface of the bobbin 31.

The bobbin 11 has four outer side surfaces provided with electrodes 45a, 45b, 45c, 45d, and 45e for surface mounting. The three pins 14 are connected to the three electrodes 45a, 45b, and 45c in one-to-one correspondence. The remaining two electrodes 45d and 45e are connected to predetermined ones of the linear conductive thin films 35 on the top surface of the bobbin 31, respectively.

These electrodes 45a through 45e are formed on the outer side surfaces of the bobbin 31 by depositing a copper layer, electroless nickel plating, and gold plating in this order. Alternatively the electrodes 45a through 45e may be formed by printing solder paste.

As illustrated in FIGS. 5 and 6, each one of the linear conductive thin films are connected to the adjacent one to form the toroidal coil as an excitation coil. Specifically, with respect to the ring-shaped groove 31a, an inner end or inner pad 35a of one conductive film 35 is connected to an outer end or outer pad 35b of an adjacent conductive film 35 by wire-bonding using a lead wire 51 such as an Al wire or an Au wire. In FIG. 5, some of the lead wires 51 alone are illustrated for convenience of illustration although the lead wires 51 are arranged throughout the circumference of the ring-shaped groove 31a.

Thus, the excitation coil is formed by a combination of the conductive films 35 and the lead wires 51 connected to each other one by one. The excitation coil has terminal electrodes 45d and 45e from which AC voltage for excitation is supplied to the excitation coil. The excitation AC voltage has, for example, a frequency ranging between several tens and several hundreds of kilohertz (kHz).

As illustrated in FIG. 4, the frame member 43 is arranged at the periphery of the top surface of the bobbin 31 and protrudes upward from the top surface of the bobbin 31. The lead wires 51 are laid at a level slightly lower than an upper surface of the frame member 43. In an area surrounded by the frame member 43, a plastic resin material 55 is loaded or fulfilled to form a cover of the core 36 in the groove 31a, the conductor pattern of films 35, and wires 51, as shown in FIG. 3.

Thus, the plastic cover 55 stably holds the magnetic core 36 at a predetermined position in the groove 31a and protects it from mechanical strain under external force. Therefore, the toroidal core 36 can keep its magnetic properties for a long period of use of the magnetic sensor.

In the embodiment, it is possible to prevent the magnetic core from being influenced by the heat in, for example, a solder reflowing operation because wire-bonding is used without use of the solder reflowing operation.

Figure 7:
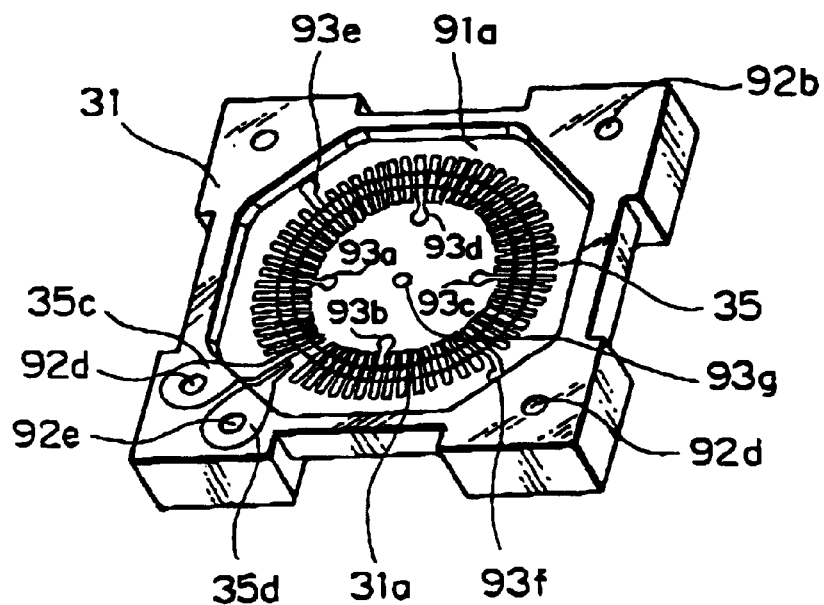
FIG. 7 is a perspective view illustrating a bobbin of a magnetic sensor according to a second embodiment of this invention.
Figure 8:
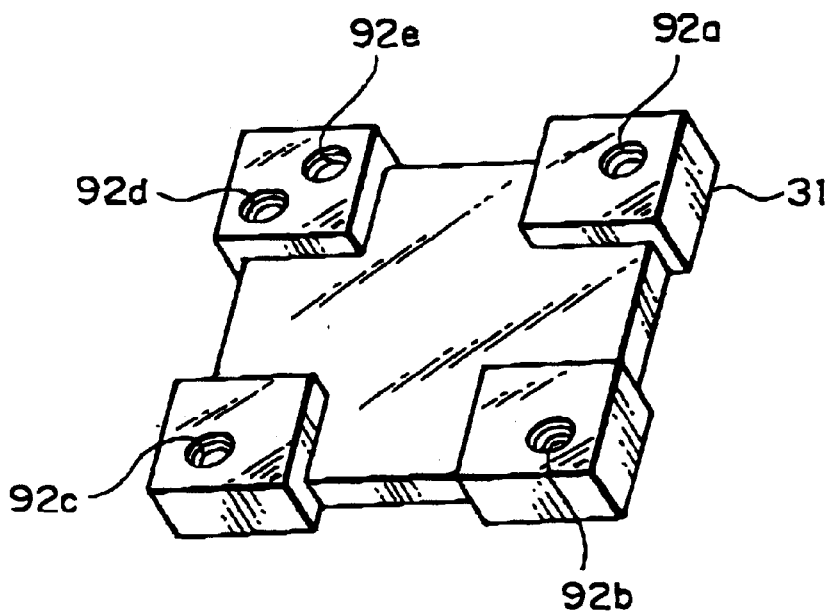
FIG. 8 is a perspective view of the bobbin in FIG. 7 as seen from a rear side.
Figure 9:
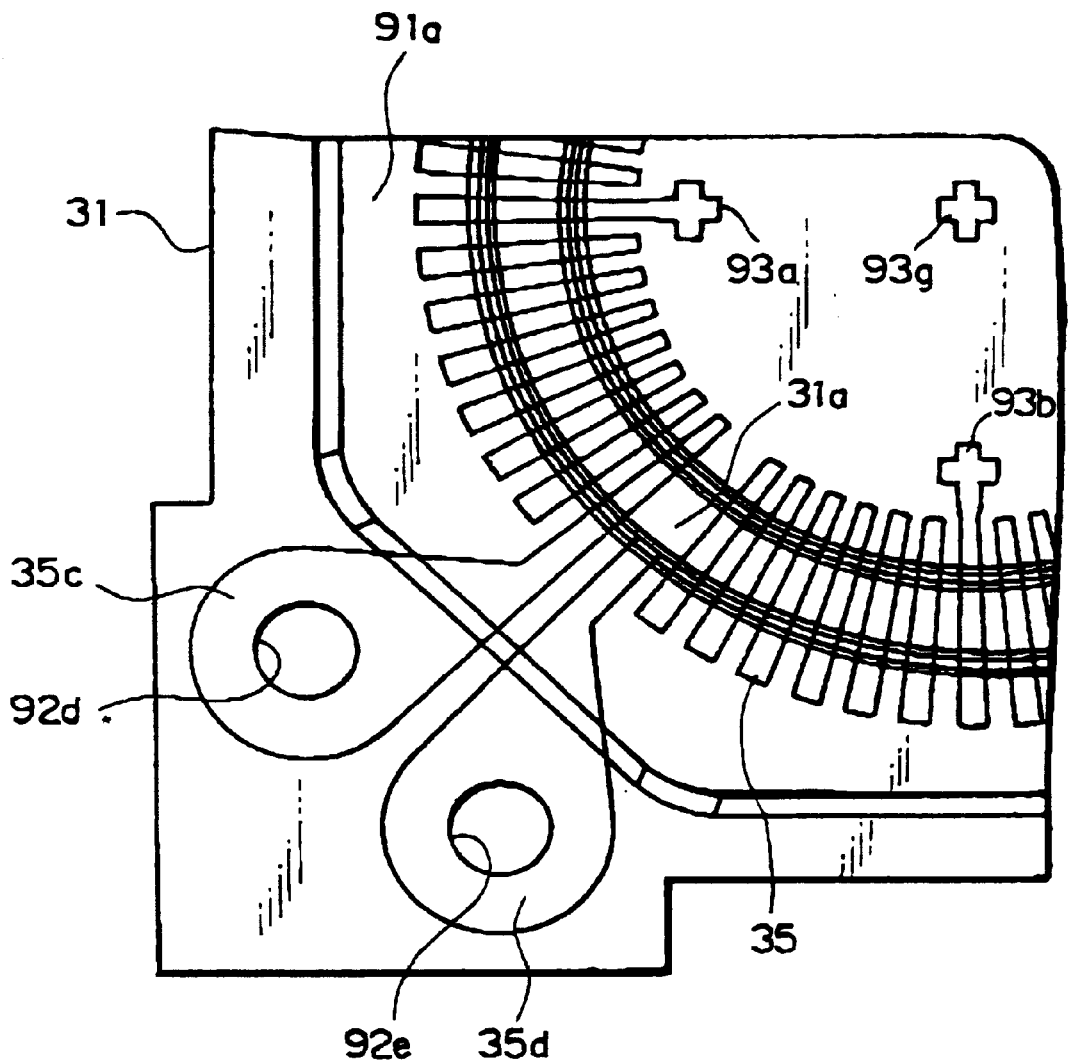
FIG. 9 is an enlarged plan view of a portion of the bobbin of FIG. 7.

Referring to FIGS. 7 through 9, a magnetic sensor according to a second embodiment of this invention shown therein is similar in structure to that of the magnetic sensor of the first embodiment (FIGS. 3–6) but different therefrom in that the bobbin 31 does not have the frame member 43, the pins 41 and terminal electrodes 45a–45e. In the following description, similar parts are designated by like reference numerals as those illustrated in FIGS. 3–6.

As illustrated in FIG. 7, the bobbin 31 has a top surface provided with a large recess 91a. In the recess 91a, the groove 31a and the conductive pattern 35 are formed. The magnetic core 36 is received in the groove 31a.

The bobbin 31 is further provided with five through-holes 92a–92e at four corners as shown in the figure. Two through-holes 92d and 92e at one corner are surrounded by lead terminals 35c and 35d of the conductor pattern 35. The magnetic sensor having the bobbin 31 may be fixedly mounted on a printed circuit board by metallic bolts or pins (not shown) inserted into the through-holes 92a–92e. The lead terminal 35c and 35d are connected to the printed circuit board and, therefore, the excitation coil is connected to the printed circuit board. The detection coils (32 and 33 in FIG. 3) are also connected to the printed circuit board through the metallic bolts or pins.

As illustrated in FIG. 9 also, the conductive pattern 35 is further provided with a plurality of marks 93a through 93g. The marks 93a through 93g are formed at a plurality of preselected positions of the conductive pattern 35. The marks 93a through 93g serve to prevent the conductive pattern 35 from being dislocated during processes of forming the conductor pattern 35. The marks 93a–93g have a circular shape as shown in FIG. 7, or can have other shapes such as, a cross shape as shown in FIG. 9 or a polygonal shape.

Figure 10:
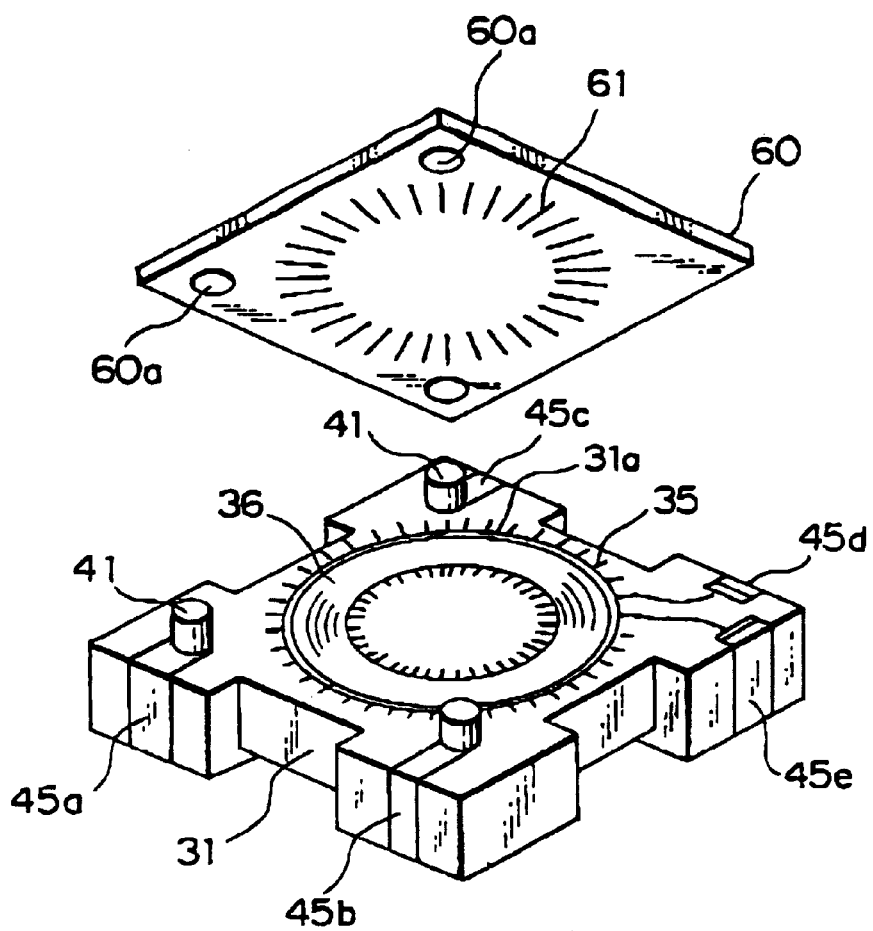
FIG. 10 is an exploded perspective view of a magnetic sensor according to a third embodiment of this invention with detection coils being omitted.
Figure 11:
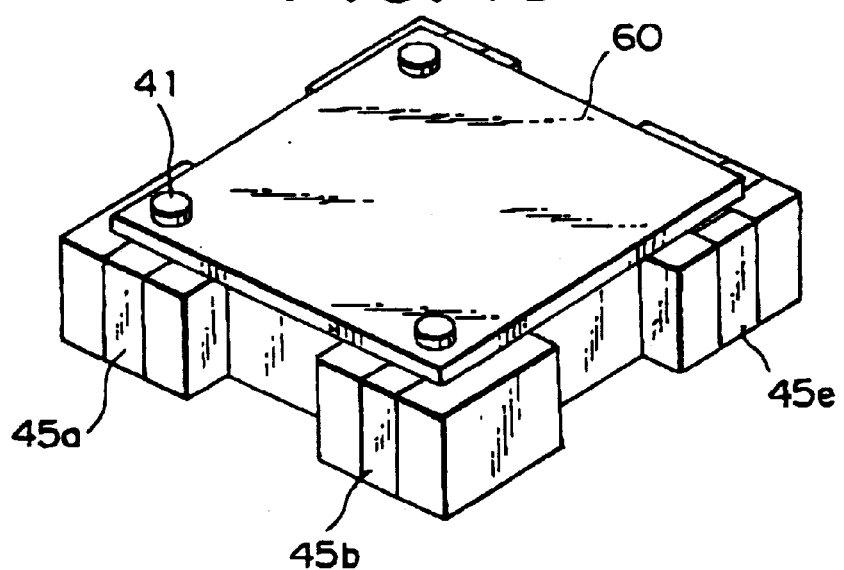
FIG. 11 is a perspective view of the magnetic sensor illustrated in FIG. 10 in which a bobbin case and a bobbin cover of a printed circuit board are coupled to each other.
Figure 12:
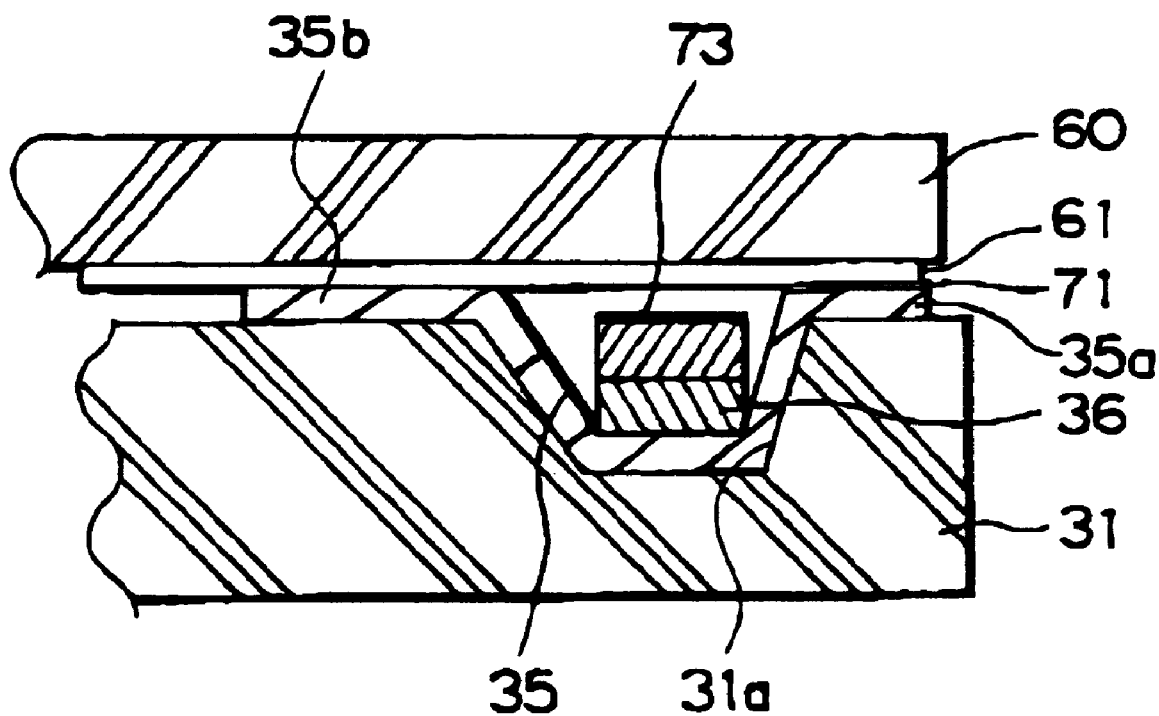
FIG. 12 is a sectional view taken along a line XII—XII in FIG. 11.

Referring to FIGS. 10, 11 and 12, a magnetic sensor according to a third embodiment of this invention is similar to magnetic sensor shown in FIGS. 3–6 except several differences as described below. The similar parts and portions are shown by the same reference numerals but will not again be described here. Farther, the detection coils are not shown for simplification of the drawings.

In this embodiment, the bobbin 31 has neither the frame member 43 nor the lead wires 51 nor plastic resin 55. In place of them, a printed circuit board 60 is disposed on the top surface of the bobbin via through-holes 60a and pins 41, respectively, to form a cover of the bobbin. The printed circuit board 60 has one surface provided with a mating conductive pattern. The conductive pattern comprises a plurality of radially-extending conductive line films 61 corresponding to the linear conductive films 35 formed on the top surface of the bobbin 31, and the conductive line films 61 have a function similar to the lead wires (51 in FIG. 6) and connect between adjacent ones of the linear conductive films 35 to form a toroidal coil as the excitation coil when the printed circuit board 60 is stacked onto the top surface of the bobbin 31.

In detail, the conductive line films 61 of the mating conductive pattern individually extend in a radial direction from a center of the printed board 60 towards a periphery and are arranged at a predetermined angular space from one another in a circumferential direction each of the conductive line films 61 of the mating conductive pattern is connected to an inner end 35a of one linear conductive film 35 and to an outer end 35b of a next adjacent conductive film 35. Thus, the conductive line films 61 of the mating conductive pattern are connected to adjacent ones of the.conductive films 35, respectively, as shown in FIG. 12.

Referring to FIG. 12, a low-melting-point solder 71 is previously adhered onto the surfaces of the conductive patterns 35 and the mating conductive patterns 61, and the printed circuit board 60 is then put onto the top surface of the bobbin 31. Thereafter, the bobbin 31 and the printed circuit board 60 with the solder between the conductive pattern 35 and the mating conductive pattern 61 are introduced into a reflow furnace kept at a temperature between 180 and 260° C. to electrically connect the conductive pattern 35 and the mating conductive pattern 61 to thereby form the toroidal excitation coil.

In order to prevent electrical short-circuiting between the conductive pattern 35 and the magnetic core 36, the magnetic core 36 is covered with an insulating film 73 containing an organic material as a basic component and deposited by chemical vapor deposition, as illustrated in FIG. 12.

The magnetic core 36 can be formed by mechanically machining a thin-plate material of a high-permeability material into a ring-shape. Alternatively, the magnetic core 36 can be formed by vapor-depositing the high-permeability material in a toroidal shape.

Figure 13:
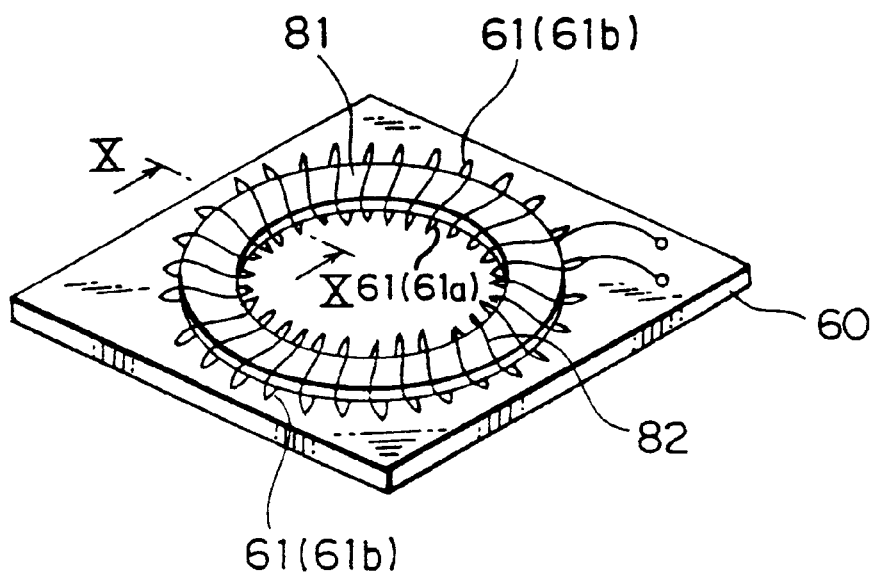
FIG. 13 is a perspective view of a bobbin cover of a printed circuit board with a thin-type toroidal core used in a magnetic sensor according to a fourth embodiment of this invention.
Figure 14:
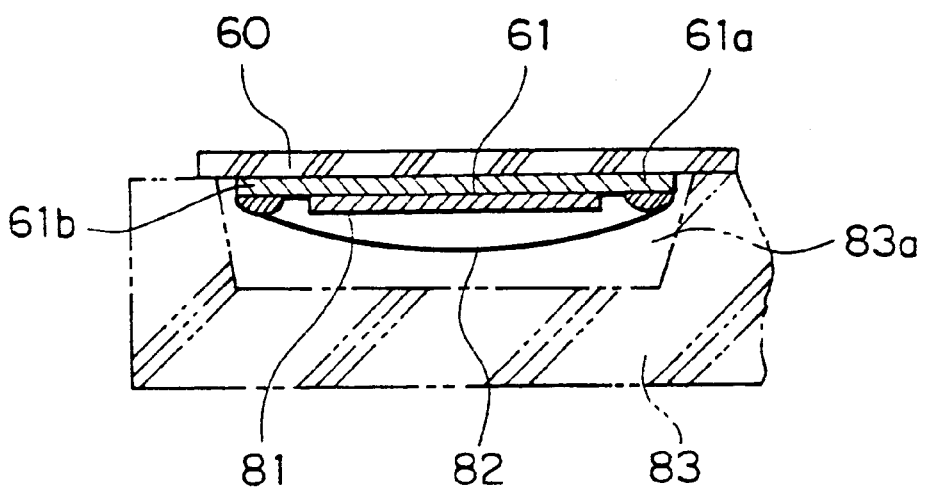
FIG. 14 is a sectional view of the bobbin cover taken along a line XIV—XIV in FIG. 13 but shown in an inverted condition assembled with a bobbin case which is partially shown by an imaginary line.

Referring to FIGS. 13 and 14, a magnetic sensor according to a fourth embodiment of this invention shown therein is different from the above mentioned first and second embodiments in a structure where the toroidal inductor is mounted on a printed circuit 60 as a bobbin cover. Similar parts are designated by like reference numerals as those illustrated in FIGS. 10–12.

As shown in FIGS. 13 and 14, a printed circuit board 60 is provided with a plurality of conductive line films 61 formed on a surface thereof. The plurality of conductive line films are collectively referred to as conductive pattern which is also represented by 61. A ring-shaped magnetic core or a toroidal core 81 is mounted on the surface having the conductive pattern 61. The magnetic core 81 has a surface subjected to an insulating treatment by chemical vapor deposition. The magnetic core 81 is adhered to the printed board 60 by the use of an adhesive The conductive pattern 61 is connected via conductive wires 82 similar to the conductive wires 51 illustrated in FIGS. 5 and 6. Specifically, an inner end 61a of one conductive line film 61 and an outer end 61b of a next adjacent conductive line film 61 are connected by wire-bonding via the conductive wire 82 which extends over the ring-shaped magnetic core from the inside to the outside of the ring. As a result, the conductive wires 82 connect all of the conductive line films 61 in series to form the toroidal excitation coil extending around the toroidal core 81.

As illustrated in FIG. 14, the printed board 60 having the toroidal core 81 and the excitation coil is mounted on an insulator bobbin 83 having a ring-shaped groove 83a which receives therein the core 81 and the conductive wires 82. Thereafter, the first and the second detection coils (not shown) are wound around the bobbin 83 and the printed circuit board 60 mounted on the bobbin 83, in the similar manner shown at 32 and 33 in FIG. 3. Thus, the magnetic sensor is completed.

As thus far been described in conjunction with the several embodiments, it is possible according to this invention to provide a small-sized high-efficiency magnetic sensor which can detect a weak magnetic field with high accuracy.

According to this invention, it is possible to simplify the structure so that the number of components and the number of working steps are reduced and the working efficiency is improved. Furthermore, it is possible to avoid the deterioration of the material characteristic of the magnetic core.

The magnetic sensor of this invention, moreover, does not require a complicated and inefficient winding operation of winding the magnet wires around the magnetic core. Instead, use is made of conductive patterns printed in a three-dimensional fashion to serve as a coil.

What is claimed is:

1. A magnetic sensor comprising:
    a bobbin,
    a toroidal inductor mounted within said bobbin, said toroidal inductor comprising a toroidal magnetic core and an excitation toroidal coil wound around said toroidal magnetic core, and
    at least one detection coil wound on said bobbin, wherein said bobbin comprises: (i) a bobbin case having a top surface in which a toroidal groove is formed, with said toroidal inductor being accommodated in said toroidal groove, and (ii) a bobbin cover coupled to said bobbin case to cover said toroidal groove,
    wherein a conductor pattern is formed on the top surface of said bobbin case, said conductor pattern comprising a plurality of angularly spaced thin-film linear conductors which each radially extend from a center portion of the top surface of said bobbin case across said toroidal groove to a peripheral portion of the top surface of said bobbin case, and
    wherein a plurality of connecting conductors radially extend over said toroidal magnetic core to connect a radial inner end of a corresponding one of said thin-film linear conductors to a radial outer end of an adjacent one of said thin-film linear conductors so that said excitation toroidal coil is formed by said conductor pattern and said connecting conductors.

2. The magnetic sensor as claimed in claim 1, wherein said bobbin is provided with two detection coils wound thereon in directions perpendicular to each other.

3. The magnetic sensor as claimed in claim 1, wherein said bobbin has a rectangular prism shape.

4. The magnetic sensor as claimed in claim 1, wherein said toroidal groove has a circular or a polygonal shape.

5. The magnetic sensor as claimed in claim 1, wherein said connecting conductors are wires, and said bobbin cover comprises a plastic resin loaded on said bobbin case to cover said connecting conductors, said toroidal magnetic core and said conductor pattern together.

6. The magnetic sensor as claimed in claim 5, further comprising a frame member formed at a periphery of said top surface of said bobbin case outside of said toroidal groove to protrude upward from said top surface of said bobbin case.

7. The magnetic sensor as claimed in claim 5, wherein a protruding frame portion is formed at a periphery of said top surface of said bobbin case outside of said toroidal groove.

8. The magnetic sensor as claimed in claim 5, wherein said toroidal magnetic core is formed from a thin plate of a high-permeability material and coated with an insulating film deposited by chemical vapor deposition.

9. The magnetic sensor as claimed in claim 5, wherein at least inner side and bottom surfaces of said groove are covered with an insulating member.

10. The magnetic sensor as claimed in claim 5, wherein a high-permeability material is deposited on a bottom of said toroidal groove in a toroidal fashion to form said toroidal magnetic core.

11. The magnetic sensor as claimed in claim 5, wherein said conductive pattern is provided with a plurality of marks formed at desired positions to correct dislocation of said conductive patterns.

12. The magnetic sensor as claimed in claim 1, wherein said bobbin cover comprises a printed circuit board having said connecting conductors formed thereon.

13. The magnetic sensor as claimed in claim 12, wherein said toroidal magnetic core is formed from a thin plate of a high-permeability material and coated with an insulating film deposited by chemical vapor deposition.

14. The magnetic sensor as claimed in claim 12, wherein at least inner side and bottom surfaces of said groove are covered with an insulating member.

15. The magnetic sensor as claimed in claim 12, wherein a high-permeability material is deposited on a bottom of said toroidal groove in a toroidal fashion to form said toroidal magnetic core.

16. The magnetic sensor as claimed in claim 12, wherein said toroidal magnetic core is coated with an insulating film containing an organic material as a base component and deposited by chemical vapor deposition in order to prevent electric short-circuiting between said conductive pattern and said toroidal magnetic core.

17. The magnetic sensor as claimed in claim 12, wherein said conductive pattern is provided with a plurality of marks formed at desired positions to correct dislocation of said conductive patterns.

18. A magnetic sensor comprising:

a bobbin, a toroidal inductor mounted within said bobbin, said toroidal inductor comprising a toroidal magnetic core and an excitation toroidal coil wound around said toroidal magnetic core, and at least one detection coil wound on said bobbin, wherein said bobbin comprises: (i) a bobbin case having a top surface in which a toroidal groove is formed, and (ii) a bobbin cover coupled to said bobbin case to cover said toroidal groove, wherein said bobbin cover comprises a printed circuit board having a conductor pattern formed on a bottom surface of said printed circuit board, said conductor pattern comprising a plurality of angularly spaced thin-film linear conductors each having a radial inner end and a radial outer end, wherein said toroidal magnetic core is fixedly mounted on said bobbin cover, with a plurality of wire connecting conductors extending over said toroidal magnetic core to connect said radial inner end of a corresponding one of said thin-film linear conductors to said radial outer end of an adjacent one of said thin-film linear conductors so that said excitation toroidal coil is formed by said conductor pattern and said wire connecting conductors, and wherein said inductor is accommodated within said toroidal groove in said bobbin case.

19. The magnetic sensor as claimed in claim 18, wherein said toroidal magnetic core is formed from a thin plate of a high-permeability material and coated with an insulating film deposited by chemical vapor deposition.

* * * * *